(12) United States Patent
Urard et al.

(10) Patent No.: US 7,685,502 B2
(45) Date of Patent: Mar. 23, 2010

(54) LDPC DECODER

(75) Inventors: Pascal Urard, Theys (FR); Laurent Paumier, Grenoble (FR)

(73) Assignee: STMicroelectronics S.A., Montrouge (FR)

( * ) Notice: Subject to any disclaimer, the term of this patent is extended or adjusted under 35 U.S.C. 154(b) by 404 days.

(21) Appl. No.: 11/158,516

(22) Filed: Jun. 22, 2005

(65) Prior Publication Data

US 2005/0283703 A1 Dec. 22, 2005

(51) Int. Cl.
*H03M 13/00* (2006.01)
*H03M 13/03* (2006.01)

(52) U.S. Cl. .................... 714/781; 714/794

(58) Field of Classification Search ............ 714/781, 714/794
See application file for complete search history.

(56) References Cited

U.S. PATENT DOCUMENTS

| | | | | |
|---|---|---|---|---|
| 6,957,375 B2* | 10/2005 | Richardson | ........... | 714/752 |
| 7,120,856 B2* | 10/2006 | Zhang et al. | ........... | 714/801 |
| 7,139,959 B2* | 11/2006 | Hocevar | ........... | 714/752 |
| 7,299,397 B2* | 11/2007 | Yokokawa et al. | ........... | 714/752 |
| 2004/0034828 A1 | 2/2004 | Hocevar | | |
| 2005/0281111 A1* | 12/2005 | Urard et al. | ........... | 365/221 |

OTHER PUBLICATIONS

French Search Report from French Patent Application No. 04/51307, filed Jun. 22, 2004.

Karkooti M. et al. "Semi-parallel reconfigurable architectures for real-time LDPC decoding" Proc., IEEE Conference on Information Technoloyg Computing, ITCC '04, vol. 1, Apr. 5, 2004, pp. 579-582.
Tong Zhang et al. "A 54 MBPS (3,6)—Regular FPGA decoder" Proc., IEEE Workshop on Signal Processing Systems, San Diego, CA, Oct. 16, 2002, pp. 127-132, XP010616589.
Selvarathinam A., et al. "A massively scaleable decoder architecture for low-density parity-check codes" Proc., IEEE International Symposium on Circuits and Systems, ISCAS 2003, Bangkok, Thailand, vol. 2 of 5, May 25, 2003, pp. 61-64, XP002260921 ISBN: 0-7803-7761-3.
Gunnam K. et al. "An LDPC decoding schedule for memory access reduction" Proc., IEEE International Conference on Acoustics, Speech, and Signal Processing, vol. 5, May 17, 2004, pp. 173-176, XP002302865.
Mansour M. M. et al. "High-throughput LDPC decoders" IEEE Transactions on Very Large Scale Integration (VLSI) systems, vol. 11, No. 6, Dec. 6, 2003, pp. 976-996, XP002302866 ISSN: 1063-8210.
Cocco M. et al. "A scalable architecture for LDPC decoding" Proc., IEEE Design, Automation and Test in Europe Conf. and Exhibition Designers Forum, Date '04, vol. 3, Feb. 16, 2004, pp. 88-93, XP010685018.

(Continued)

*Primary Examiner*—Joseph D Torres
(74) *Attorney, Agent, or Firm*—Lisa K. Jorgenson; James H. Morris; Wolf, Greenfield & Sacks, P.C.

(57) ABSTRACT

An LDPC decoder has a determined number of processing units operating in parallel. Storage circuitry contains first words having a juxtaposition of a first type of message. The storage circuitry also contains second words having a juxtaposition of a second type of message. A message provision unit provides each processing unit with the messages. A message write unit may write words into the storage circuitry in a way that depends on the contents of the words. The message provision unit may provide data in a way that depends on the contents of the words.

6 Claims, 3 Drawing Sheets

OTHER PUBLICATIONS

Blanksby A.J. et al. "A 690-mW 1-Gb/s 1024-b, rate-1/2 low-density parity-check code decode" IEEE Journal of Solid-State Circuits IEEE USA, vol. 37, No. 3, Mar. 2002, pp. 404-412, XP002302867 ISSN: 0018-9200.

Mansour M.M. et al. "Architecture-aware low-density parity-check codes" Proc., IEEE International Symposium on circuits and Systems, Bangkok, Thailand, vol. 2, May 25, 2003, pp. II 57-II 60, XP002302868 ISBN: 0-7803-7761-3.

* cited by examiner

LDPC DECODER

BACKGROUND OF THE INVENTION

1. Field of the Invention

The present invention relates to an LDPC (Low Density Parity Check) decoder.

2. Discussion of the Related Art

LDPC decoding enables obtaining performance very close to the theoretical Shannon limit. LDPC decoders generally have better performance than turbo-code decoders and are currently used in broadcasting systems, for example, satellite digital television broadcasting systems.

The LDPC decoding consists, for a given word s containing k bits, of transmitting a word u containing n bits, among which n-k additional bits called parity bits which fulfill n-k parity equations. The matrix H having n-k lines and n columns verifying the following relation is called the code control matrix:

$$H*^t u = 0 \quad (1)$$

The size of the matrices H generally used is significant since they may comprise more than 60,000 columns and 50,000 lines. Further, such matrices are practically empty and may comprise one "1" for approximately 10,000 "0"s. This is why they are called low-density matrices.

The number of "1"s in the line is called the check node degree of a line and the number of "1"s in the column is called the bit node degree. There are two types of LDPC codes: regular codes and irregular codes. Matrix H of a regular code has a constant number of "1"s per line and per column. The check node and bit node degrees are then constant. An irregular code has no constant check node degrees and/or bit node degrees and has a more random character. However, the best performances are obtained for irregular codes. The problem of an irregular matrix is that it is random. The decoding can then be difficult. European digital satellite television standard DVB-S2 advocates for the use of a matrix H which has a constant check node degree, and a bit node degree that can take three values.

FIG. 1 shows a graph corresponding to an equivalent representation of a matrix H of an LDPC code. Each circle 10 represents a bit node. As an example, six bit nodes BNi, with i ranging from 0 to 5, are shown. Each square 12 represents a check node. As an example, four check nodes CNj, with j ranging from 0 to 3, are shown. Branches 14 connect given bit nodes BNi to given check nodes CNj. The presence of a branch 14 between a bit node of index i and a check node of index j means that the equivalent matrix H has a "1" at line j and at column i. Note Ne the total number of branches 14 in the graph. Number Ne thus corresponds to the number of "1"s of matrix H.

The matrix H equivalent to the graph shown in FIG. 1 is the following:

$$H = \begin{pmatrix} 1 & 1 & 0 & 0 & 1 & 0 \\ 1 & 0 & 1 & 0 & 0 & 1 \\ 0 & 1 & 0 & 1 & 1 & 0 \\ 0 & 0 & 1 & 1 & 0 & 1 \end{pmatrix} \quad (2)$$

Such a matrix H has a constant bit node degree equal to 2 and a constant check node degree equal to 3.

LDPC decoding uses log-likelihood ratios (LLR). For a transmitted information bit d to which corresponds a signal y received by the decoder after addition of the transmit channel noise, the LLR ratio of bit d with respect to signal y is defined as follows:

$$LLR(y) = LLR(d \mid y) = \ln \frac{P(d = 0 \mid y)}{P(d = 1 \mid y)} \quad (3)$$

where P(d=0|y) is the probability for transmitted bit d to be equal to 0 according to the received value y and P(d=1|y) is the probability for transmitted bit d to be equal to 1 according to the received value y. Such probabilities especially depend on the features of the transmit channel. The larger LLR(y), the greater the probability for transmitted bit d to be equal to "0". As an example, it may be decided, for a received signal y, that if LLR(y) is negative, then transmitted bit d is a "1" and that, otherwise, transmitted bit d is a "0".

LDPC decoding is based on a so-called message passing algorithm. Such an algorithm consists of associating with each bit node a received signal to which corresponds an initial LLR ratio, and of iteratively exchanging messages between bit nodes 10 and check nodes 12, along branches 14 of the graph corresponding to matrix H. The exchanged messages are log likelihood ratios and enable determining, after several iterations, for each received signal a corrected LLR ratio based on which the bit which has been transmitted is finally determined.

An iteration of such an algorithm mainly comprises two steps:

a "bit node determination" step which consists, for each bit node, of gathering the messages transmitted to the bit node by the check nodes to which the bit node is connected and of sending a new message to each check node to which the bit node is connected; and a "check node determination" step which is the symmetrical operation and which consists, for each check node, of gathering the messages transmitted to the check node by the bit nodes to which the check node is connected and of sending a new message to each bit node to which the check node is connected.

It can actually be considered that each branch 14 corresponds to a memory element from which a message is read before each bit or check node determination step and into which a message is written after each bit or check node determination step.

LDPC decoding algorithm will now be more specifically described for a graph having dbn bit nodes BNi, i ranging from 0 to dbn-1, and dcn check nodes CNj, j ranging from 0 to dcn-1. For the first iteration, the bit node determination step is carried out by using, for each bit node BNi, value LLR($y_i$) where $y_i$ is the received signal associated with bit node BNi. Values LLR($y_i$) are obtained from the characteristics of the transmit channel. Message $v_{i \to j}$, called a bit node message, transmitted by bit node BNi to check node CNj, is initialized as follows:

$$v_{i \to j} = LLR(y_i) \quad (4)$$

The next check node determination step consists, for each check node $CN_j$, of transmitting a message $w_{j \to i}$, called a check node message, to each bit node BNi connected to check node CNj. Each message $w_{j \to i}$ is determined from the parity equation associated with check node CNj. For this purpose, the messages $v_{k \to j}$ provided by the bit nodes BNk connected to check node CNj are simply used, except for bit node BNi to which message $w_{j \to i}$ is transmitted, and message $w_{j \to i}$ is obtained by verifying the parity equation. Let S1j be the subset of [0, dbn-1)] containing the indexes k such that bit nodes BNk are connected to check node CNj. The expression of $w_{j\to i}$ is given by the following relation:

$$w_{j\to i} = \ln\left(\frac{1 + \prod_{k\in S1j, k\neq i} \tanh(v_{k\to j}/2)}{1 - \prod_{k\in S1j, k\neq i} \tanh(v_{k\to j}/2)}\right) \quad (5)$$

For the next iterations, the bit node determination step is carried out, for each bit node BNi, based on messages $w_{j\to i}$ provided by check nodes CNj connected to bit node BNi. For each check node CNj connected to bit node BNi, a message $v_{i\to j}$ corresponding to the sum of initial value $LLR(y_i)$ and of all the messages received from the check nodes connected to bit node BNi, except for the message transmitted by node CNj, is provided. Let S2i be the subset of [0, dcn-1] containing indexes k such that check nodes CNk are connected to bit node BNi. The expression of $v_{i\to j}$ thus is the following:

$$v_{i\to j} = LLR(y_i) + \Sigma_{k\in S2i, k\neq j} w_{k\to i} \quad (6)$$

Once a determined number of iterations has been performed, a value Li corresponding to a corrected LLR ratio is determined for each bit node BNi. Li is determined by the following equation:

$$L_i = LLR(y_i) + \sum_{k\in S2i} w_{k\to i} \quad (7)$$

It is then decided, for each bit node BNi, based on value $L_i$, which is the value of the bit associated with the received signal $y_i$. For example, if Li is negative or zero, it may be decided that the bit is equal to 1 and if Li is strictly positive, it may be decided that the bit is equal to 0.

FIG. 2 schematically shows an example of the forming of an LDPC decoder 20 implementing the previously-described algorithm.

Decoder 20 comprises a processing unit 22 comprising NB separate elementary processing units 24 ($Mod_j$, j ranging from 1 to NB) capable of performing in parallel calculation operations to provide the bit and check node messages.

Decoder 20 comprises a RAM 26 in which are stored the bit node messages provided by units 24 after a bit node determination step and check node messages provided by units 24 after a check node determination step. Memory 26 comprises Ne/NB lines. At each line of memory 26 is stored a word containing a number of bits equal to the product of number NB of units 24 by the number of bits that can be processed by a unit 24. Each word corresponds to the juxtaposition of NB bit node messages or of NB check node messages.

Decoder 20 comprises an input memory 28 in which are stored initial values $LLR(y_i)$, i ranging from 0 to dbn-1. Decoder 20 also comprises an output memory 30 in which are stored values Li, i ranging from 0 to dbn-1.

Processing unit 22 is connected to a multiplexer 32, controlled by a control signal S1 which, according to the value of control signal S1, provides processing unit 22 with a word from input memory 28, a word directly read from memory 26, or a word provided by a rearrangement unit 34 and which corresponds to a word of memory 26 in which the order of the messages forming the word has been modified. More specifically, when a word is transmitted to processing unit 22, the message at the first position in the word is transmitted to the first elementary processing unit $Mod_1$, etc., and the message at the $NB^{th}$ position in the word is transmitted to the $NB^{th}$ elementary processing unit $Mod_{NB}$.

Processing unit 22 is capable of successively providing words corresponding to the juxtaposition of NB bit node messages or of NB check node messages. More specifically, when a word is transmitted to processing unit 22, the message at the first position in the word is provided by first elementary processing unit $Mod_1$, etc., and the message at the $NB^{th}$ position in the word is provided by the $NB^{th}$ elementary processing unit $Mod_{NB}$. The words provided by processing unit 22 may be transmitted to output memory 30 or to a rearrangement unit 38 capable of providing a new word from a received word and corresponding to the received word in which the order of the NB bit node messages or of the NB check node messages is modified.

Rearrangement unit 38 drives a first input of a multiplexer 40, controlled by a signal S3. Processing unit 22 drives a second input of multiplexer 40. According to the value of S3, multiplexer 40 provides memory 26 with the word provided by rearrangement unit 38 or by processing unit 22.

Decoder 20 comprises an address provision unit 42, for example, comprising a ROM, at each line of which are stored an address of memory 26 and rearrangement data. Rearrangement units 34 or 38 are capable of modifying the order of the messages in a word based on rearrangement data. The rearrangement data may correspond to a number of shift positions. By successively reading the lines of address provision unit 42, a series of addresses in memory 26 is obtained in an order different from the regular order of the reading from the lines of memory 26.

Upon operation of decoder 20, for a bit node determination step or for a check node determination step, an elementary unit 24 is brought to use bit or check node messages which are located at different locations in memory 26.

Generally, the messages are distributed in memory 26 so that, in a check node determination step, the words can be read successively according to the regular order of the reading from memory 26, the bit node message placed at the first position of each word of memory 26 being used by first elementary unit $MOD_1$, etc., and the message placed at the $NB^{th}$ position being used by the $NB^{th}$ elementary unit $MOD_{NB}$. After a check node determination step, each check node message is stored at the same position as the bit node message previously associated with the same branch.

In the next bit node determination step, the rearrangement unit reads the words from memory 26 in the read order provided by address provision unit 42. For each read word, rearrangement unit 34 provides a new word corresponding to the read word in which the message order is modified based on the rearrangement datum of address provision unit 42. The messages are, for example, shifted to the left by a number of positions equal to the number of shift positions stored in address provision unit 42 for the read address. The message at the first position of the new word is then provided to first elementary unit $Mod_1$, etc. and the message at the $NB^{th}$ position of the new word is provided to the $NB^{th}$ elementary processing unit $Mod_{NB}$.

From a word transmitted by processing unit 22, rearrangement unit 38 provides a new word that it stores in memory 26 according to an order provided by address provision unit 42 so that each bit node message is stored at the same location as the previous check node message associated with the same branch. For example, each new word corresponds to the received word in which the bit node messages are shifted to the right by a number of shift positions stored in address provision unit 42.

Memory 26 is generally of large size since Ne can be greater than 200,000. As an example, a processing unit 22 may contain several hundreds of elementary processing units 24 operating in parallel. If each message is coded over some ten bits, each word manipulated by rearrangement units 34, 38 comprises several thousands of bits. A rearrangement circuit capable of performing circular shift operations on such words can take up several square millimeters when it is formed on an integrated circuit according to a conventional semiconductor technology. This corresponds to a non-negligible portion of the total decoder surface area.

SUMMARY OF THE INVENTION

The present invention aims at obtaining an LDPC decoder formed on an integrated circuit having a reduced surface area.

The present invention also aims at obtaining an LDPC decoder formed on an integrated circuit having a simple structure.

To achieve these and other objects, the present invention provides an LDPC decoder comprising a determined number of processing units operating in parallel, each processing unit being capable of successively receiving messages of a first type and of successively providing messages of a second type based on a first processing of the messages of the first type and of receiving messages of the second type and of providing messages of the first type based on a second processing of the messages of the second type, the second processing being different from the first processing; a storage means capable of containing first words and second words, each first word containing a juxtaposition of messages of the first type in a number equal to said determined number, and each second word containing a juxtaposition of messages of the second type in a number equal to said determined number; a message provision unit capable of reading first words or second words from the storage means; of providing each processing unit, for each first read word, with a message of the first type at a position in the first word which depends on the processing unit; and of providing each processing unit, for each second read word, with a message of the second type at a position in the second word which depends on the processing unit; and a message write unit capable of writing, into the storage means, first words, each first word containing messages of the first type, each provided by a different processing unit, each message of the first type being at a position in the first word which depends on the associated processing unit; and of writing, into the storage means, second words, each second word containing messages of the second type, each provided by a different processing unit, each message of the second type being at a position in the second word which depends on the associated processing unit, the message provision unit further being capable of providing said message of the first type at a position in the first word which depends on the first word and said message of the second type at a position in the second word which depends on the second word, or the message write unit being further capable of writing each message of the first type at a position in the first word which depends on the first word and each message of the second type at a position in the second word which depends on the second word.

According to an embodiment of the present invention, the message provision unit and the message write means are simultaneously capable of respectively performing read and write operations from and into the storage means.

According to an embodiment of the present invention, the storage means comprises locations arranged according to a determined order, each location being capable of containing a first word or a second word, and the message provision unit is capable of successively reading the first words from the storage means according to the determined order, and of successively reading the second words from the storage means according to an order different from the determined order, or the message write unit is capable of successively writing the first words into the storage means according to the determined order, and of successively writing the second words into the storage means according to an order different from the determined order.

According to an embodiment of the present invention, the processing units are arranged according to a determined order and the message provision unit is capable of providing said message of the first type at a position in the first word which depends on the first word, the message write unit being capable of writing into the storage means a first word formed of messages of the first type arranged according to said determined order, and of writing into the storage means a second word formed of messages of the second type arranged according to said determined order.

According to an embodiment of the present invention, the processing units are arranged according to a determined order, and the message write unit is capable of writing each message of the first type at a position in the first word which depends on the first word and each message of the second type at a position in the second word which depends on the second word, the message provision unit being capable of reading from the storage means a first word and of providing each processing unit with a message of the first type contained in the first read word, the messages of the first type being arranged in the first word according to said determined order, and of reading from the storage means a second word and of providing each processing unit with a message of the second type contained in the second read word, the messages of the second type being arranged in the second word according to said determined order.

According to an embodiment of the present invention, the storage means comprises locations each associated with an address, the decoder comprising a means for providing a second address of the storage means from a first address of the storage means.

The present invention also provides an iterative LDPC decoding method, comprising a determined number of processing units operating in parallel, and in which an iteration comprises the steps of:

a) reading first words from a storage means, each first word containing a juxtaposition of messages of a first type in a number equal to the determined number;

b) providing each processing unit, for each first read word, with a message of the first type at a position in the first word which depends on the processing unit;

c) having each processing unit successively provide messages of a second type based on a first processing of the messages of the first type;

d) storing in the storage means second words, each second word corresponding to a juxtaposition of messages of the second type in a number equal to the determined number and each provided by a different processing unit, each message of the second type being at a position in the second word which depends on the associated processing unit;

e) reading the second words from the storage means;

f) providing each processing unit, for each second read word, with a message of the second type at a position in the second word which depends on the processing unit;

g) having each processing unit successively provide new messages of the first type based on a second processing of the messages of the second type, the second processing being different from the first processing;

h) storing in the storage means new first words, each new first word corresponding to a juxtaposition of messages of the first type in a number equal to a determined number and each provided by a different processing unit, each message of the first type being at a position in the new first word which depends on the associated processing unit. Further, at step b), the position of the message of the first type in the first word further depends on the first word and, at step f), the position of the message of the second type in the second word further depends on the second word or, at step d), each message of the second type is at a position in the second word which depends on the second word and, at step h), each message of the first type is at a position in the new first word which depends on the new first word.

According to an embodiment of the present invention, the first words are read from the storage means according to a first order of reading from the storage means, the second words being read from the storage means according to a second order of reading from the storage means different from the first order.

According to an embodiment of the present invention, the first words are stored in the storage means according to the first read order, the second words being stored in the storage means according to the second read order.

According to an embodiment of the present invention, the storage means comprises a memory capable of containing at the same locations alternately first words or second words, for a first word and a second word stored at a same location in the storage means, and for a same processing unit, at steps b) and f), the position in the second word of the message of the second type provided to said processing unit being equal to the difference, modulo the determined number, between the determined number and the position in the first word of the message of the first type provided to said processing unit.

The foregoing and other objects, features, and advantages of the present invention will be discussed in detail in the following non-limiting description of specific embodiments in connection with the accompanying drawings.

DETAILED DESCRIPTION

Figure 1:
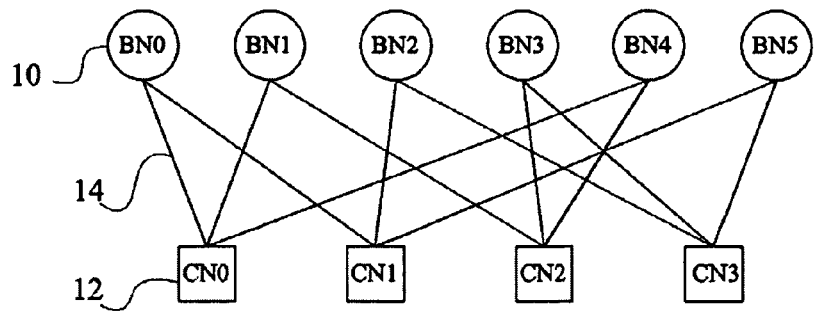
FIG. 1, previously described, shows a graph illustrating an example of an LDPC decoding.

For clarity, the same elements have been designated with the same reference numerals in the different drawings.

The present invention comprises eliminating one of rearrangement units 34, 38. A check node message "exchanged" between check node NCj and bit node NBi, obtained at a check node determination step, will then not be written at the same "location" as the bit node message "exchanged" between the same bit node NBi and the same check node NCj obtained at a bit node determination step. A rearrangement of the messages of each read word must then be performed upon reading of the words from memory 26 both in a bit node determination step and a check node determination step or a rearrangement of the messages of each word resulting from processing unit 22 must then be performed on reading of the words from memory 26 both in a bit node determination step and a check node determination step.

Figure 2:
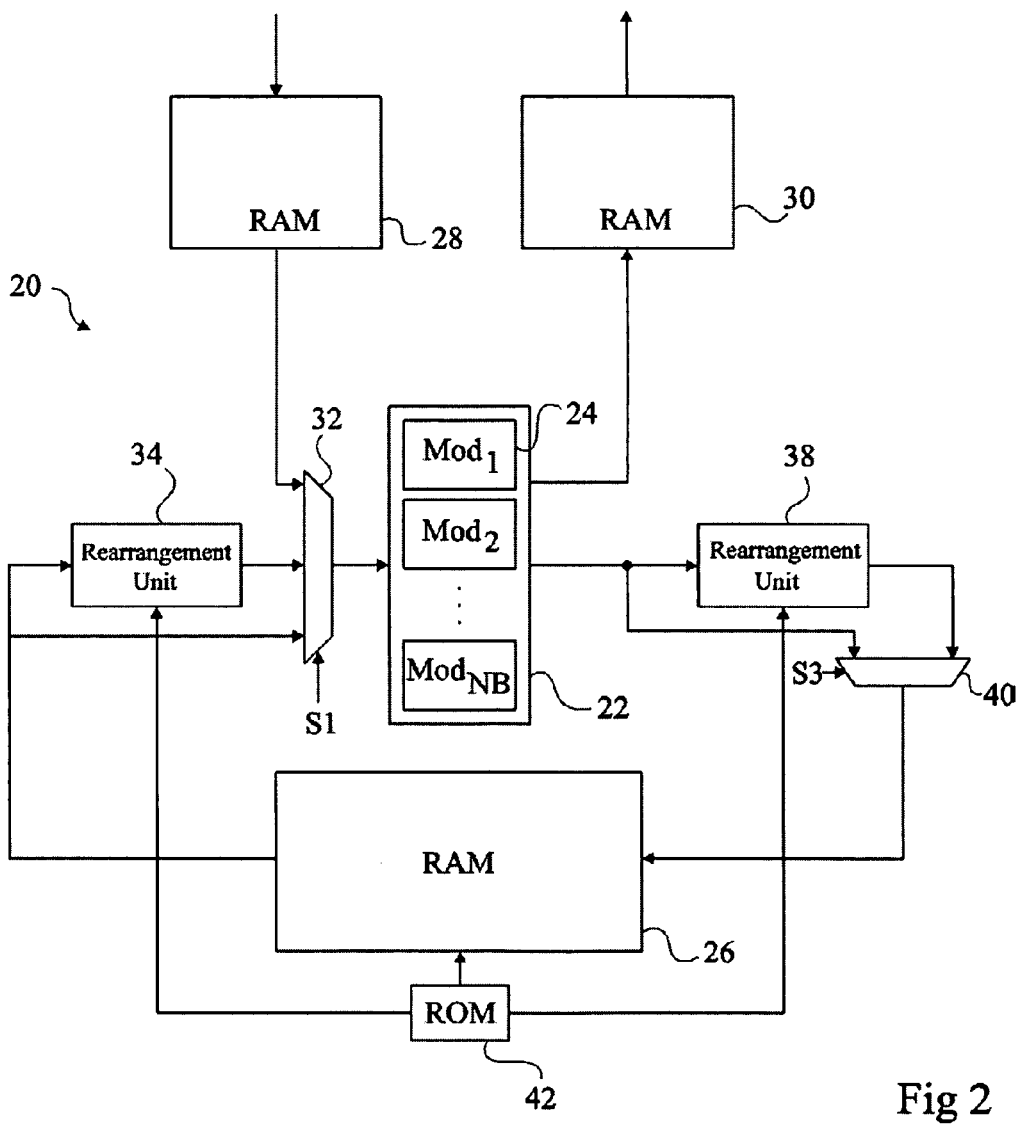
FIG. 2, previously described, schematically shows an example of the forming of a conventional LDPC decoder.
Figure 3:
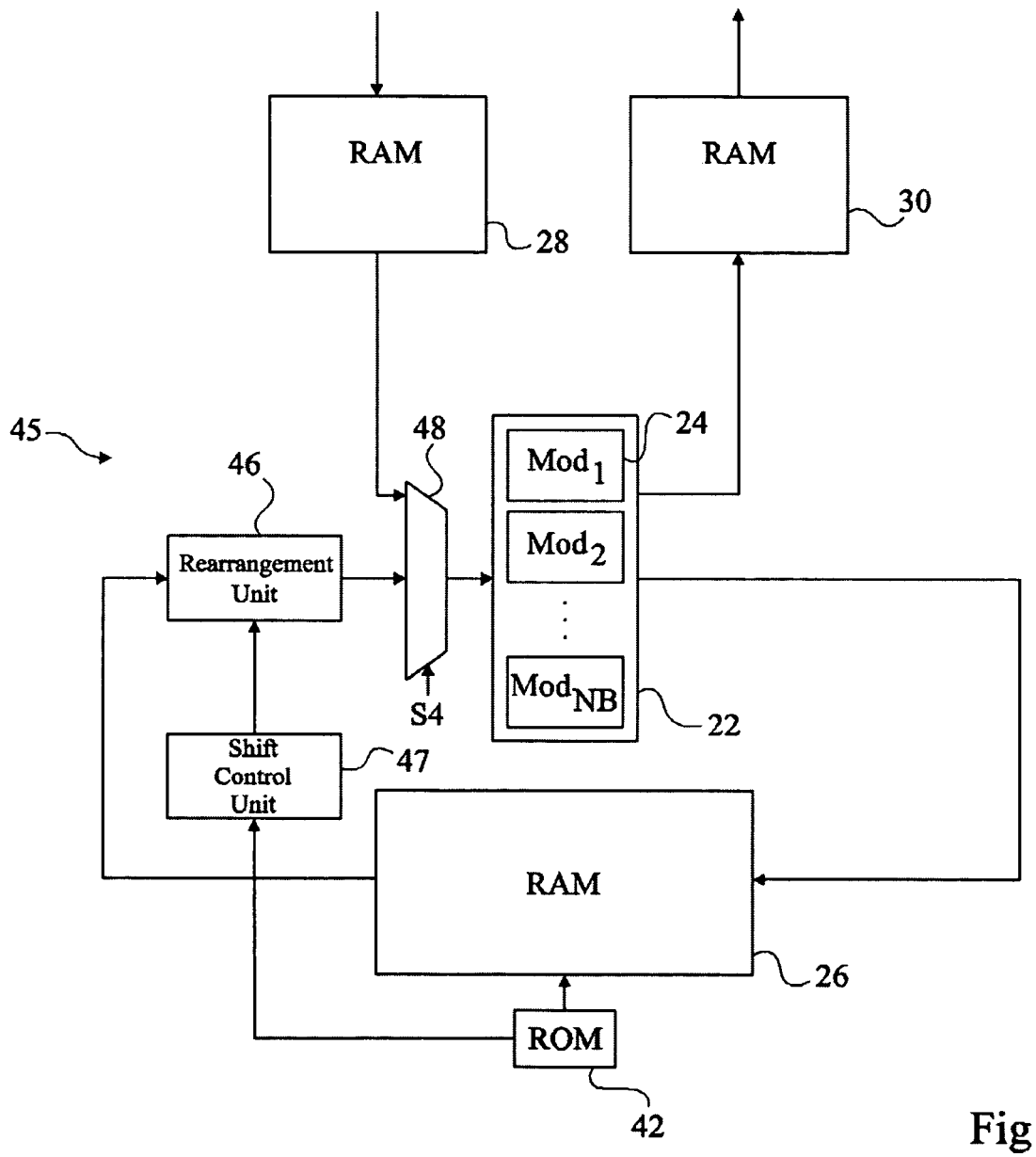
FIG. 3 shows an example of embodiment of an LDPC decoder according to the present invention.

FIG. 3 shows an example of embodiment of an LDPC 45 according to the present invention. Conversely to the decoder shown in FIG. 2, the present decoder 45 comprises a single rearrangement unit 46 capable of reading words from memory 26, possibly according to an order different from the regular read order, and of performing a rearrangement of the messages forming the word. Rearrangement unit 46 is controlled by a shift control unit 47 which indicates based on the rearrangement data provided by address provision unit 42 how the messages of the read word are to be rearranged.

A multiplexer 48, controlled by a signal S4, is connected at a first input to rearrangement unit 46 and at a second input to input memory 28. According to the value of S4, multiplexer 48 provides processing unit 22 successively with words stored in input memory 28 or words provided by rearrangement unit 46. Processing unit 22 drives output memory 30 and memory 26. The words provided by processing unit 22 are transmitted to output memory 30 or to memory 26.

A comparison between the operation of decoder 20 shown in FIG. 2 and of decoder 45 according to the present invention will now be described for the following matrix H:

$$H = \begin{pmatrix} 1 & 0 & 1 & 0 & 1 & 0 & 0 & 0 & 1 & 1 & 1 & 0 \\ 0 & 0 & 1 & 1 & 1 & 0 & 1 & 1 & 0 & 0 & 0 & 1 \\ 1 & 1 & 0 & 0 & 0 & 1 & 1 & 0 & 0 & 0 & 1 & 1 \\ 1 & 0 & 0 & 0 & 1 & 1 & 0 & 1 & 1 & 1 & 0 & 0 \\ 0 & 1 & 1 & 1 & 0 & 0 & 0 & 1 & 0 & 1 & 0 & 1 \\ 0 & 1 & 0 & 1 & 0 & 1 & 1 & 0 & 1 & 0 & 1 & 0 \end{pmatrix} \quad (8)$$

Number Ne of "1"s of matrix H is equal to 36. Matrix H is associated with a graph with 12 bit nodes and with 6 check bit nodes. A (bit or check node) message exchanged between a bit node and a check node is called ek, with k ranging from 0 to 35. The numbering of messages ek is performed along the order of the lines of matrix H and is illustrated by the following matrix H':

$$H' = \quad (9)$$
$$\begin{pmatrix} e0 & 0 & e1 & 0 & e2 & 0 & 0 & 0 & e3 & e4 & e5 & 0 \\ 0 & 0 & e6 & e7 & e8 & 0 & e9 & e10 & 0 & 0 & 0 & e11 \\ e12 & e13 & 0 & 0 & 0 & e14 & e15 & 0 & 0 & 0 & e16 & e17 \\ e18 & 0 & 0 & 0 & e19 & e20 & 0 & e21 & e22 & e23 & 0 & 0 \\ 0 & e24 & e25 & e26 & 0 & 0 & 0 & e27 & 0 & e28 & 0 & e29 \\ 0 & e30 & 0 & e31 & 0 & e32 & e33 & 0 & e34 & 0 & e35 & 0 \end{pmatrix}$$

As an example, it is considered that number NB of elementary processing units 24 is equal to 3. For decoder 20 shown in FIG. 2, messages ek, k ranging from 0 to 35, may be stored in memory 26 according to an arrangement corresponding to the following memory MEM:

$$MEM = \begin{bmatrix} e0 & e13 & e25 \\ e1 & e12 & e24 \\ e2 & e14 & e26 \\ e3 & e15 & e27 \\ e4 & e16 & e29 \\ e5 & e17 & e28 \\ e6 & e18 & e30 \\ e7 & e19 & e32 \\ e8 & e20 & e31 \\ e9 & e21 & e34 \\ e10 & e22 & e33 \\ e11 & e23 & e35 \end{bmatrix} \begin{matrix} 0 \\ 1 \\ 2 \\ 3 \\ 4 \\ 5 \\ 6 \\ 7 \\ 8 \\ 9 \\ 10 \\ 11 \end{matrix} \quad (10)$$

where the last column corresponds to the lines of memory 26.

Inversions should be noted between messages e12 and e13, e24 and e25, e28 and e29, e31 and e32, and e33 and e34. Such inversions avoids messages intended to be used by the same elementary processing unit 24 to be in the same word. For example, messages e0 and e12 used in first elementary processing unit Mod$_1$ in a bit node determination step are contained in two different words.

In a check node determination step, the words of memory 26 are read in the regular order of the reading from memory 26. For each read word, the message at the first position is used by first elementary unit Mod$_1$, the message at the second position is used by second elementary unit Mod$_2$, and the message at the third position is used by third elementary unit Mod$_3$. As an example, first elementary unit Mod$_1$ thus successively receives bit node messages e0 to e5, from which it determines check node messages e0 to e5, respectively stored at the same place as previous messages e0 to e5. The distribution of messages ei, i ranging from 0 to 35, in memory 26 thus corresponds to matrix MEM of relation (10).

In a bit node determination step, rearrangement units 34, 38 use the information in address provision unit 42 to read and write the right messages at the right places.

As an example, address provision unit 42 comprises, at each line, a line number of memory 26 and a number of shift positions. In the present example, address provision unit 42 is formed of a memory having a composition corresponding to the following matrix ROM:

$$ROM = \begin{bmatrix} 0 & 0 \\ 1 & 1 \\ 6 & 1 \\ 7 & 0 \\ 2 & 2 \\ 8 & 2 \\ 9 & 0 \\ 3 & 1 \\ 10 & 2 \\ 4 & 0 \\ 11 & 1 \\ 5 & 2 \end{bmatrix} \quad (11)$$

where the first column corresponds to line numbers of memory 26 and the second column corresponds to a number of shift positions.

In a bit node determination step, rearrangement unit 34 reads the words from memory 26 in the order indicated by address provision unit 42. As an example, the determination of the bit nodes of index 0, 1, and 2 is obtained from lines 0, 1, 2 of address provision unit 42 which respectively send back to lines 0, 1, and 6 of memory 26. Rearrangement unit 34 thus reads the word stored at line 0 of memory 26 and performs a leftward shift of the messages of the read word by a number 0 of shift positions and provides message e0, at the first position of the modified word, to first elementary processing unit Mod$_1$, message e13, at the second position, to second elementary processing unit Mod$_2$, and message e25, at the third position, to third elementary processing unit Mod$_3$. Rearrangement unit 34 then reads the word stored at line 1 of memory 26 and performs a leftward shift of the messages of the read word by 1 shift position. Finally, rearrangement unit 34 reads the word stored at line 6 of memory 26 and performs a leftward shift of the messages in the read word by 1 shift position.

At the end of the determination of bit nodes n° 0, 1 and 2, rearrangement unit 38 successively receives the next three words (e0, e13, e25), (e12, e24, e1), (e18, e30, e6). To properly write word (e18, e30, e6), rearrangement unit 38 uses the rearrangement data stored at line n° 2 of address provision unit 42 which indicates a number of shift positions of 1. Rearrangement unit 38 then provides a new word (e6, e18, e30) corresponding to the initial word circularly shifted to the right by one shift position. Line n° 2 of address provision unit 42 sends back to line n° 6 of memory 26. Rearrangement unit 38 thus writes the new word (e6, e18, e30) at line n° 6 of memory 26. The distribution of messages ei, i ranging from 0 to 35, in memory 26 thus corresponds again to matrix MEM of relation (10).

At the first iteration, processing unit 22 reads initial values ui, i ranging from 0 to 11, stored in memory 28 and corresponding to initial values LLR(y$_i$). Rearrangement unit 38 initializes memory 26 according to the following matrix MEM:

$$MEM = \begin{bmatrix} u0 & u1 & u2 \\ u2 & u0 & u1 \\ u4 & u5 & u3 \\ u8 & u6 & u7 \\ u9 & u10 & u11 \\ u10 & u11 & u9 \\ u2 & u0 & u1 \\ u3 & u4 & u5 \\ u4 & u5 & u3 \\ u6 & u7 & u8 \\ u7 & u8 & u6 \\ u11 & u9 & u10 \end{bmatrix} \begin{matrix} 0 \\ 1 \\ 2 \\ 3 \\ 4 \\ 5 \\ 6 \\ 7 \\ 8 \\ 9 \\ 10 \\ 11 \end{matrix} \quad (12)$$

In the present invention, data ui are written into memory 26 by using the order of the lines of memory 26 provided by address provision unit 42 but without the application of a shifting, an arrangement of data ui in memory 26 is thus obtained, according to the following matrix MEM:

$$MEM = \begin{bmatrix} u0 & u1 & u2 \\ u0 & u1 & u2 \\ u3 & u4 & u5 \\ u6 & u7 & u8 \\ u9 & u10 & u11 \\ u9 & u10 & u11 \\ u0 & u1 & u2 \\ u3 & u4 & u5 \\ u3 & u4 & u5 \\ u6 & u7 & u8 \\ u6 & u7 & u8 \\ u9 & u10 & u11 \end{bmatrix} \begin{matrix} 0 \\ 1 \\ 2 \\ 3 \\ 4 \\ 5 \\ 6 \\ 7 \\ 8 \\ 9 \\ 10 \\ 11 \end{matrix} \quad (13)$$

In the following check node determination step, rearrangement unit 46 successively reads, line after line, the words from memory 26 and performs, for a word read from memory 26 at a determined line number, a circular rightward shift, by the shift position number indicated at the same line number of address provision unit 42. The new obtained messages provided by processing unit 22 are then written into memory 26 in the normal order of the lines of memory 26 with no shift. An arrangement of the messages in memory 26 corresponding to the following matrix MEM is thus obtained:

$$MEM = \begin{bmatrix} e0 & e13 & e25 \\ e1 & e12 & e24 \\ e2 & e14 & e26 \\ e3 & e15 & e27 \\ e4 & e16 & e29 \\ e5 & e17 & e28 \\ e6 & e18 & e30 \\ e7 & e19 & e32 \\ e8 & e20 & e31 \\ e9 & e21 & e34 \\ e10 & e22 & e33 \\ e11 & e23 & e35 \end{bmatrix} \begin{matrix} 0 \\ 1 \\ 2 \\ 3 \\ 4 \\ 5 \\ 6 \\ 7 \\ 8 \\ 9 \\ 10 \\ 11 \end{matrix} \quad (14)$$

In the next bit node determination step, rearrangement unit 46 provides messages to processing unit 22 by reading the words from memory 26 in the order indicated by address provision unit 42 and by performing, on each read word, a leftward shift by the number of shift positions indicated by address provision unit 42. As an example, rearrangement unit 46 successively provides the three words (e0, e13, e25), (e12, e24, e1), and (e18, e30, e6) respectively from lines 0, 1 and 2 of address provision unit 42.

The new obtained words provided by processing unit 22 are then written into memory 26 by following the order indicated by address provision unit 42 but with no shift. As an example, processing unit 22 successively provides three new words (e0, e13, e25), (e12, e24, e1), and (e18, e30, e6) which are respectively written at lines n° 0, 1, and 6 of memory 26.

A message distribution is then obtained in memory 26, which corresponds to the following matrix MEM:

$$MEM = \begin{bmatrix} e0 & e13 & e25 \\ e12 & e24 & e1 \\ e26 & e2 & e14 \\ e15 & e27 & e3 \\ e4 & e16 & e29 \\ e28 & e5 & e17 \\ e18 & e30 & e6 \\ e7 & e19 & e32 \\ e31 & e8 & e20 \\ e9 & e21 & e34 \\ e33 & e10 & e22 \\ e23 & e35 & e11 \end{bmatrix} \begin{matrix} 0 \\ 1 \\ 2 \\ 3 \\ 4 \\ 5 \\ 6 \\ 7 \\ 8 \\ 9 \\ 10 \\ 11 \end{matrix} \quad (15)$$

The message arrangement in memory 26 is thus different after a check node determination step and after a bit node determination step.

As described previously in relation with the first iteration, at the next check node determination step, rearrangement unit 46 successively reads, line after line, the words from memory 26 and performs, for a word read from memory 26 at a determined line number, a circular shift to the right, by the shift position number indicated at the same line number of address provision unit 42. Thus, rearrangement unit 46 successively reads words (e0, e13, e25), (e12, e24, e1), etc. until (e23, e35, e11) and provides processing unit 22 successively with words (e0, e13, e25), (e1, e12, e24), etc. until (e11, e23, e35), that is, by performing a circular shift to the right of the messages by a number of positions equal to the number of shift positions 0, 1, etc. to 2 respectively stored at lines n° 0, 1, etc. to 11 of address provision unit 42.

The shift direction (rightwards or leftwards) is obtained from the data stored in memory 42. Thus, when a leftward shift operation has to be performed, the numbers of shift positions contained in memory 42 are directly used. When a rightwards shift operation is to be performed, an equivalent leftward shift value corresponding to the difference, modulo NB, between NB and the number of shift positions provided by memory 42 is determined. In the present example, a circular shift by 2 positions to the right is equivalent to a circular shift by 1 position to the left. This enables using a rearrangement unit 46 only performing leftward shift operations.

Figure 4:
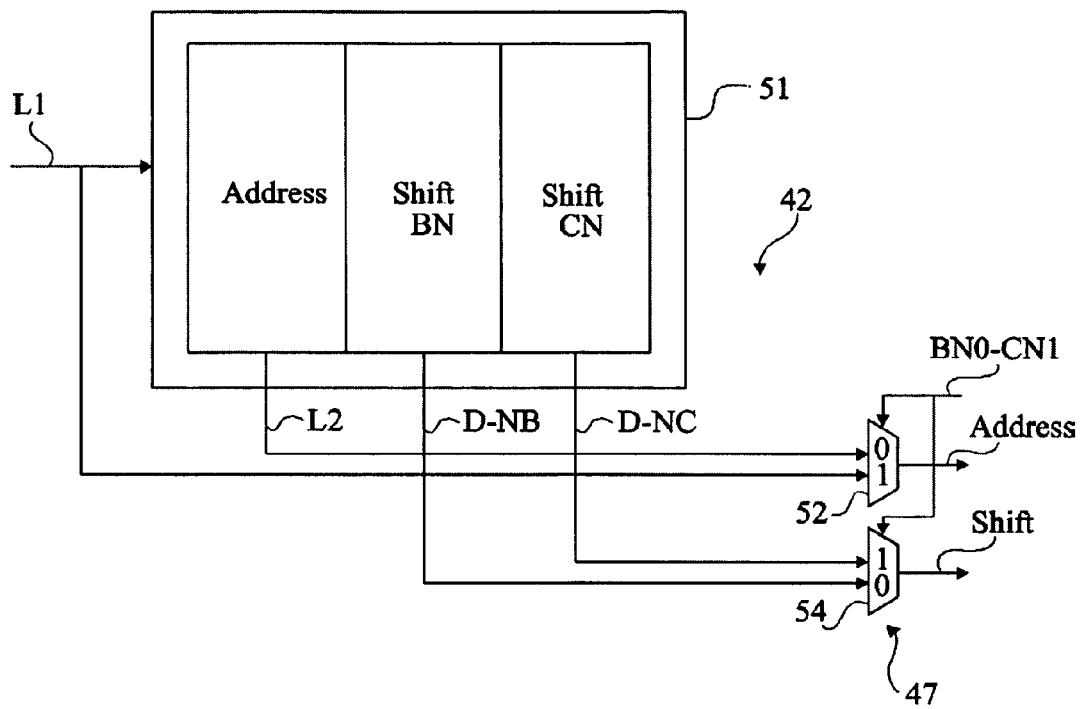
FIG. 4 shows an example of the forming of an element of the circuit of FIG. 3.

FIG. 4 shows a first example of the forming of shift control unit 47 and of address provision unit 42. Address provision unit 42 comprises a memory 51, for example, a ROM, capable of receiving a signal L1 representative of an initial line number of memory 26 and of providing a signal L2 representative of a new line number of memory 26, a signal D_NB representative of a number of shift positions (to the left) to be used in a bit node determination step, and a signal D_NC representative of a number of a shift positions (to the right) to be used in a check node determination step. Address provision unit 42 comprises a multiplexer 52, controlled by a binary control signal BN0_CN1, receiving signal L1 at a first input and signal L2 at a second input and providing a signal Address to memory 26. As an example, when signal BN0_CN1 is high, which indicates that a check node determination step is going on, signal Address is equal to L1. The lines of memory 26 are then successively read. When signal BN0_CN1 is at a low state, which indicates that a bit node determination step is going on, signal Address is equal to L2. The lines of memory 26 are thus read in the order provided by address provision unit 42. Shift control unit 47 comprises a multiplexer 54, controlled by signal BN0_CN1, receiving signal D_NB on a first input and signal D_NC on a second input and providing a signal Shift to rearrangement unit 46. As an example, when signal BN0_CN1 is high, which indicates that a check node determination step is going on, signal Shift is equal to D_NC and when signal BN0_CN1 is low, which indicates that a bit node determination step is going on, signal Shift equal to D_NB.

Figure 5:
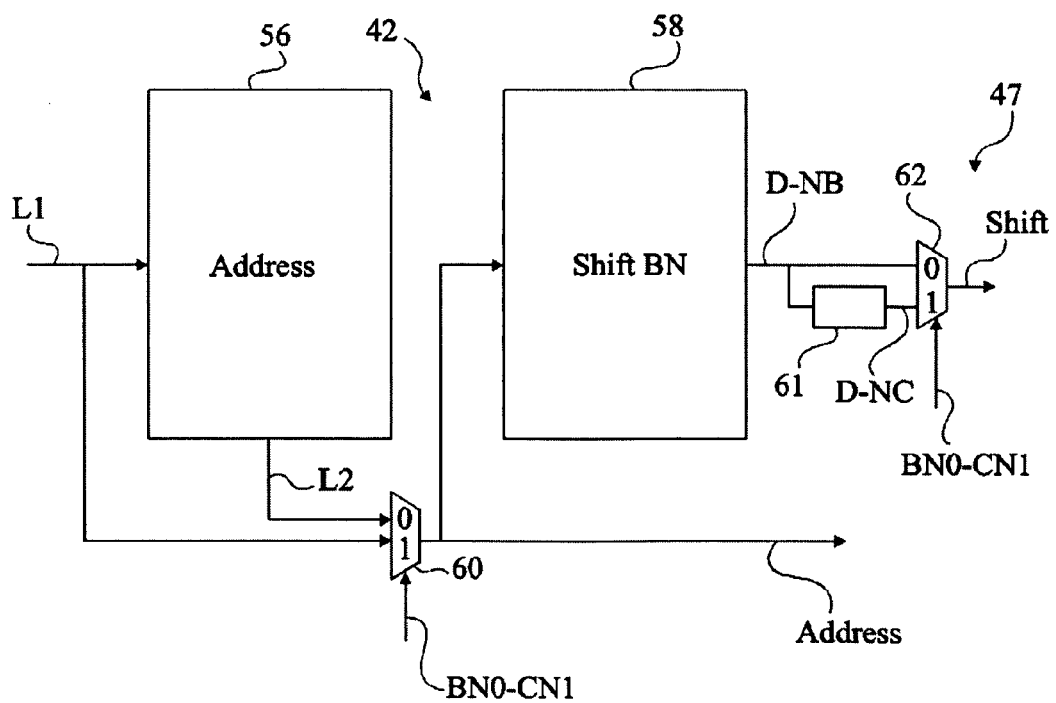
FIG. 5 shows another example of the forming of the element of FIG. 4.

FIG. 5 shows a second example of embodiment of shift control unit 47 and of address provision unit 42. Address provision unit 42 is formed of first and second separate memories 56, 58. First memory 56 is capable of receiving signal L1 and of providing signal L2. Address provision unit 42 comprises a multiplexer 60, controlled by binary control signal BN0_CN1, receiving signal L1 on a first input and signal L2 on a second input and providing signal Address to memory 26 and to second memory 58. Second memory 58 is capable of receiving signal Address and of providing the number of shift positions D_NB adapted to the implementation of a bit node determination step. Unit 47 comprises a unit 61 capable of determining the shift number D_NC to be used in a check node determination step based on D_NB. Shift control unit 47 comprises a multiplexer 62, controlled by signal BN0_CN1, receiving signal D_NB on a first input and signal D_NC on a second input and providing a signal Shift to rearrangement unit 46. As an example, when signal BN0_CN1 is high, which indicates that a check node determination step is going on, signal Shift is equal to D_NC and when signal BN0_CN1 is low, which indicates that a bit node determination step is going on, signal Shift is equal to D_NB.

Decoder 45 according to the present invention comprises a single rearrangement unit 46 as compared to a conventional decoder 20 which comprises two. The surface necessary to the forming of shift control unit 47 is negligible. The surface of a rearrangement unit is thus practically completely freed. Further, rearrangement unit 46 of decoder 45 according to the present invention may have a structure identical to that of a conventional rearrangement unit 34, 38.

Further, rearrangement unit 46 is only used, in the present example of embodiment, in read operations from memory 26. Decoder 45 according to the present invention thus enables simultaneously performing read and write operations in memory 26 and thus enables optimizing the duration of an iteration of the decoding algorithm.

According to an alternative of the present invention, the decoder comprises a single rearrangement unit 46 provided between processing unit 22 and memory 26, downstream of processing unit 22 according to the data flow direction. Rearrangement unit 46 is then capable of writing a word into memory 26 based on a word provided by processing unit 22, by modifying the position of the messages in the word provided by processing unit 22. In a bit node determination step or a check node determination step, the message at the first position of each read word is provided to first elementary processing unit 24, the message at the second position of each read word is provided to second elementary processing unit 24, etc. and the message at the last position of each read word is provided to the last elementary processing unit 24. Rearrangement unit 46 then modifies the message position in each word provided by processing unit 22 so that all messages to be provided to a same elementary processing unit 24 at the next determination step are at the same position in each word. A different distribution of the bit node messages and of the check node messages is then obtained in memory 26, as in the decoder previously described as an example, respectively after a bit node determination step or a check node determination step. Since such a rearrangement unit is only used in write operations into memory 26, read and write operations can thus be simultaneously performed, which enables optimizing the duration of an iteration of the decoding algorithm.

According to another variation of the present invention, memory 26 is replaced with first and second memories, the bit node messages being stored in the first memory and the check node messages being stored in the second memory. With such a structure, in a bit node determination step, the check node messages are read from the second memory while the new bit node messages obtained from the read check node messages are written into the first memory and, in a check node determination step, the bit node messages are read from the first memory while the new check node messages obtained from the read bit node messages are written into the second memory.

Of course, the present invention is likely to have various alterations, modifications, and improvements which will readily occur to those skilled in the art. In particular, the rearrangement unit may perform an operation other than a shift. Block permutations may be used.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A message passing machine intended for use in an LDPC decoder comprising:

a first number of processing units of a processor, the processing units operating in parallel to decode a received signal, each processing unit successively receiving messages of a first type and successively providing messages of a second type based on a first processing of the messages of the first type, and receiving messages of the second type, and providing processed messages of the first type based on a second processing of the messages of the second type, the second processing being different from the first processing;

a storage unit in a random access memory (RAM) coupled to the processing units, the storage unit stores first words and second words when the first and second words are received by the storage unit from the processing units, wherein each first word comprises messages of the first type in a number equal to said first number, and each second word comprises messages of the second type in a number equal to said first number; wherein each first word from the first words comprises messages of the first type, each provided by a different processing unit, each message of the first type being at a position in the first word which depends on the associated processing unit; and each second word from the second words comprising messages of the second type, each provided by a different processing unit, each message of the second type being at a position in the second word which depends on the associated processing unit;

a shift control unit coupled to a rearrangement unit in a read-only memory (ROM), the shift control unit being configured to generate first shift control information for the first words and second shift control information for the second words, wherein the shift control unit is configured to provide the first shift control information and the second shift control information to the rearrangement unit;

the rearrangement unit configured to, when the rearrangement unit reads at least one of the first words and the second words from the storage unit and receives the first and second shift control information from the shift control unit:
  to rearrange the first at least partially based on the first shift control information to provide rearranged first words;
  to rearrange the second words at least partially based on the second shift control information to provide rearranged second words;
  to provide, to each processing unit, for each first rearranged word, a message of the first type at a position in the first rearranged word which depends on the processing unit; and
  to provide to each processing unit, for each second rearranged word, a message of the second type at a position in the second rearranged word which depends on the processing unit;
  wherein the rearrangement unit provides said message of the first type at the position in the first rearranged word which depends on the first shift control information and said message of the second type at a position in the second rearranged word which depends on the second shift control information, or wherein the rearrangement unit writes each message of the first type at a position in the first rearranged word which depends on the first shift control information and each message of the second type at a position in the second rearranged word which depends on the second shift control information.

2. The message passing machine of claim 1, wherein the rearrangement unit and a message write unit simultaneously perform read and write operations from and into the storage unit.

3. The message passing machine of claim 1, wherein the storage unit comprises locations arranged according to a first order, each location comprising a first word or a second word, and wherein the rearrangement unit successively reads the first words from the storage unit according to the first order, and successively reads the second words from the storage unit according to an order different from the first order, or wherein a message write unit successively writes the first words into the storage unit according to the first order, and successively writes the second words into the storage unit according to an order different from the first order.

4. The message passing machine of claim 1, wherein the processing units are arranged according to a first order and wherein the rearrangement unit provides said message of the first type at a position in the first word which depends on the first word, a message write unit writing into the storage unit a first word formed of messages of the first type arranged according to said first order, and writing into the storage unit a second word formed of messages of the second type arranged according to said first order.

5. The message passing machine of claim 1, wherein the processing units are arranged according to a first order and wherein a message write unit writes each message of the first type at a position in the first word which depends on the first word and each message of the second type at a position in the second word which depends on the second word, the rearrangement unit reading from the storage unit a first word and providing each processing unit with a message of the first type contained in the first read word, the messages of the first type being arranged in the first word according to said first order, and reading from the storage unit a second word and of providing each processing unit with a message of the second type contained in the second read word, the messages of the second type being arranged in the second word according to said first order.

6. The message passing machine of claim 1, wherein the storage unit comprises locations each associated with an address, the decoder comprising means for providing a second address of the storage unit from a first address of the storage unit.

* * * * *